United States Patent
Chan et al.

(10) Patent No.: US 9,831,393 B2
(45) Date of Patent: Nov. 28, 2017

(54) WATER RESISTANT SURFACE MOUNT DEVICE PACKAGE

(75) Inventors: Alex Chi Keung Chan, Hong Kong (CN); Charles Chak Hau Pang, Hong Kong (CN)

(73) Assignee: CREE HONG KONG LIMITED, Shatin, New Territories (HK)

( * ) Notice: Subject to any disclaimer, the term of this patent is extended or adjusted under 35 U.S.C. 154(b) by 0 days.

(21) Appl. No.: 13/192,293

(22) Filed: Jul. 27, 2011

(65) Prior Publication Data
US 2012/0025227 A1    Feb. 2, 2012

Related U.S. Application Data

(60) Provisional application No. 61/369,565, filed on Jul. 30, 2010.

(51) Int. Cl.
*H01L 29/22*    (2006.01)
*H01L 33/48*    (2010.01)
(Continued)

(52) U.S. Cl.
CPC ........... *H01L 33/486* (2013.01); *H01L 33/62* (2013.01); *H01L 24/73* (2013.01); *H01L 25/0753* (2013.01);
(Continued)

(58) Field of Classification Search
CPC . H01L 25/0753; H01L 33/504; H01L 33/486; H01L 33/62
(Continued)

(56) References Cited

U.S. PATENT DOCUMENTS

| 4,946,547 A | 8/1990 | Palmour |
| 5,200,022 A | 4/1993 | Kong |

(Continued)

FOREIGN PATENT DOCUMENTS

| CN | 1875491 | 12/2006 |
| CN | 1875495 | 12/2006 |

(Continued)

OTHER PUBLICATIONS

Office Action from U.S. Appl. No. 12/957,225, dated Aug. 24, 2012.
(Continued)

*Primary Examiner* — Matthew E Warren
(74) *Attorney, Agent, or Firm* — Koppel, Patrick, Heybl & Philpott

(57) ABSTRACT

The present invention is directed to LED packages and LED displays utilizing water resistant packages with improved structural integrity and customizable attributes. In some embodiments, the improved structural integrity is provided by various features in the lead frame that the casing material encompasses to improve the adhesion between the lead frame and the casing for a stronger, water resistant package. Moreover, in some embodiments the improved structural integrity and water resistance is further provided by cavity features that improve adhesion between the cavity and a protective encapsulant. Some embodiments also provide for packages with a greater overall height than the length of their side-exposed solder pins, which improves gel coverage of the side-exposed solder pins between adjacent packages.

21 Claims, 10 Drawing Sheets

(51) Int. Cl.
*H01L 33/62* (2010.01)
*H01L 25/075* (2006.01)
*H01L 23/00* (2006.01)

(52) U.S. Cl.
CPC .............. *H01L 2224/48091* (2013.01); *H01L 2224/48465* (2013.01); *H01L 2224/73265* (2013.01); *H01L 2924/09701* (2013.01); *H01L 2924/1815* (2013.01); *H01L 2933/0033* (2013.01)

(58) Field of Classification Search
USPC ............................................ 257/89, 99, 100
See application file for complete search history.

(56) References Cited

U.S. PATENT DOCUMENTS

| | | | | |
|---|---|---|---|---|
| 5,266,817 | A | 11/1993 | Lin | 257/89 |
| RE34,861 | E | 2/1995 | Davis | |
| 6,624,491 | B2* | 9/2003 | Waitl | H01L 33/486 257/434 |
| 7,394,148 | B2 | 7/2008 | Karnezos | 257/686 |
| 8,288,793 | B2 | 10/2012 | Kim et al. | 257/99 |
| 8,827,479 | B2 | 9/2014 | Kobayashi et al. | 362/97 |
| 2002/0066905 | A1* | 6/2002 | Wang | B08B 3/02 257/91 |
| 2004/0046242 | A1 | 3/2004 | Asakawa | 257/678 |
| 2004/0079957 | A1* | 4/2004 | Andrews et al. | 257/100 |
| 2004/0120155 | A1* | 6/2004 | Suenaga | 362/362 |
| 2006/0102918 | A1 | 5/2006 | Su et al. | 257/99 |
| 2007/0158668 | A1 | 7/2007 | Tarsa et al. | |
| 2007/0235845 | A1* | 10/2007 | Xuan | H01L 33/486 257/676 |
| 2007/0262328 | A1 | 11/2007 | Bando | 257/79 |
| 2007/0295975 | A1* | 12/2007 | Omae | 257/89 |
| 2008/0012036 | A1* | 1/2008 | Loh | H01L 33/483 257/99 |
| 2008/0023036 | A1 | 1/2008 | Ha et al. | 257/99 |
| 2008/0041625 | A1 | 2/2008 | Cheong | |
| 2008/0093720 | A1 | 4/2008 | Hiew et al. | 257/679 |
| 2008/0173884 | A1 | 7/2008 | Chitnis et al. | |
| 2008/0179611 | A1 | 7/2008 | Chitnis et al. | |
| 2008/0277685 | A1 | 11/2008 | Kim et al. | |
| 2009/0050907 | A1 | 2/2009 | Yuan et al. | 257/88 |
| 2009/0057850 | A1 | 3/2009 | Moy | |
| 2009/0072251 | A1 | 3/2009 | Chan et al. | 257/89 |
| 2009/0129085 | A1 | 5/2009 | Aizar et al. | 362/247 |
| 2009/0230413 | A1 | 9/2009 | Kobayakawa et al. | |
| 2009/0283781 | A1 | 11/2009 | Chan et al. | |
| 2010/0084681 | A1 | 4/2010 | Nakajima et al. | 257/99 |
| 2010/0090239 | A1 | 4/2010 | Lin et al. | 257/98 |
| 2010/0155748 | A1 | 6/2010 | Chan et al. | |
| 2010/0193816 | A1 | 8/2010 | Liu | 257/98 |
| 2010/0237378 | A1 | 9/2010 | Lin et al. | 257/99 |
| 2011/0095316 | A1 | 4/2011 | Chen et al. | 257/98 |
| 2012/0235187 | A1 | 9/2012 | Ng et al. | 257/98 |
| 2015/0204525 | A1 | 7/2015 | Shen | |

FOREIGN PATENT DOCUMENTS

| | | |
|---|---|---|
| CN | 101071797 | 4/2007 |
| CN | 101012330 | 8/2007 |
| CN | 101164165 | 4/2008 |
| CN | 101388161 | 3/2009 |
| CN | 201294227 | 8/2009 |
| CN | 201294227 Y | 8/2009 |
| CN | 101887889 A | 11/2010 |
| CN | 102214647 | 10/2011 |
| CN | 102386307 A | 3/2012 |
| CN | 202662602 U | 1/2013 |
| CN | 102945845 A | 2/2013 |
| CN | 103178192 A | 3/2013 |
| EP | 2148369 A1 | 1/2010 |
| JP | 058960 | 2/1993 |
| JP | 2004228387 | 8/2004 |
| JP | 200847916 | 2/2008 |
| JP | 200898218 | 4/2008 |
| JP | 2008218764 | 9/2008 |
| JP | 2009200403 | 9/2009 |
| TW | I245437 | 6/2006 |
| WO | WO 2010/081403 A1 | 7/2010 |
| WO | WO 2010081403 | 7/2010 |

OTHER PUBLICATIONS

International Search Report and Written Opinion for counterpart PCT/CN2011/077823 dated Oct. 20, 2011.
International Preliminary Report and Written Opinion for PCT Patent Application No. PCT/CN2010/001864, dated Oct. 26, 2012.
Pub No. 2007-0262328, Date Nov. 15, 2007, Bando, et al.
International Search Report and Written Opinion for Appl. No. PCT/CN2010/001864, dated Nov. 22, 2010.
Office Action from U.S. Appl. No. 12/758,702, dated Oct. 9, 2012.
Response to OA from U.S. Appl. No. 12/758,702, dated Jan. 3, 2013.
Office Action from U.S. Appl. No. 12/758,702, dated Mar. 12, 2013.
Response to OA from U.S. Appl. No. 12/758,702, dated Jul. 12, 2013.
Office Action from U.S. Appl. No. 12/939,096, dated Nov. 13, 2012.
Response to OA from U.S. Appl. No. 12/939,096, dated Feb. 13, 2013.
Office Action from U.S. Appl. No. 12/939,096, dated Feb. 28, 2013.
Response to OA from U.S. Appl. No. 12/939,096, dated May 28, 2013.
Office Action from U.S. Appl. No. 12/939,096, dated Jun. 24, 2013.
Office Action from U.S. Appl. No. 12/957,225, dated Mar. 25, 2013.
Response to OA from U.S. Appl. No. 12/957,225, dated May 15, 2013.
Office Action from U.S. Appl. No. 12/957,225, dated Jun. 3, 2013.
Response to OA from U.S. Appl. No. 12/957,225, dated Jun. 7, 2013.
Office Action from U.S. Appl. No. 12/758,702, dated Sep. 17, 2013.
Second Notification of Rectification from Chinese Patent Appl. No. 201320304753.2, dated Jan. 2, 2014.
Office Action from U.S. Appl. No. 12/939,096, dated Feb. 5, 2014.
Office Action from U.S. Appl. No. 12/957,225, dated Apr. 30, 2014.
Office Action from Japanese Patent Appl. No. 2013-504088, dated Jul. 1, 2014.
Office Action from U.S. Appl. No. 13/904,282, dated Oct. 22, 2014.
Office Action from Japanese Appl. No. 2013-504088, dated Jun. 2, 2015.
Office Action from Chinese Patent Appl. No. 201010621778.6, dated Dec. 31, 2014.
Extended European Search Report from European Appl. No. 10849646.4-1551, dated Mar. 19, 2015.
Office Action from U.S. Appl. No. 12/957,225, dated Jan. 21, 2015.
Office Action from U.S. Appl. No. 13/904,282, dated Mar. 3, 2015.
Supplementary European Search Report from European Patent Appl No. 10849646.4-1551/2559065, dated Apr. 9, 2015.
First Office Action from Chinese Patent appl. No. 2011800455336, dated May 29, 2015.
First Office Action from Chinese Patent Appl. No. 201180053012.5, dated Jul. 3, 2015.
Second Office Action from Chinese Patent appl. No. 201010621778.6, dated Jul. 13, 2015.
Office Action from U.S. Appl. No. 13/904,282, dated Jun. 11, 2015.
Office Action from U.S. Appl. No. 12/939,096, dated Oct. 23, 2015.
Notice of Issuance from Chinese Patent Appl. No. 201010621778.6, dated Dec. 11, 2015.
Second Office Action from Chinese Patent Appl. No. 2011800455336, dated Nov. 20, 2015.
Office Action from U.S. Appl. No. 12/957,225, dated Nov. 6, 2013.
Decision of Rejection for Chinese Application No. 2011806455336; dated Jun. 14, 2016.
Office Action for U.S. Appl. No. 12/939,096; Dated Nov. 18, 2016.
Office Action for U.S. Appl. No. 13/904,282; Dated Nov. 21, 2016.

(56) References Cited

OTHER PUBLICATIONS

Chinese Search Report on Application No. 2013102084312; Dated Jun. 1, 2017.
Office Action for U.S. Appl. No. 12/939,096; Dated Jun. 2, 2017.
First Office Action for Chinese Application No. 2013102084312; Dated Jun. 16, 2017.
Notification of Reexamination for Chinese Application No. 2011800455336; Dated Mar. 1, 2017.

* cited by examiner

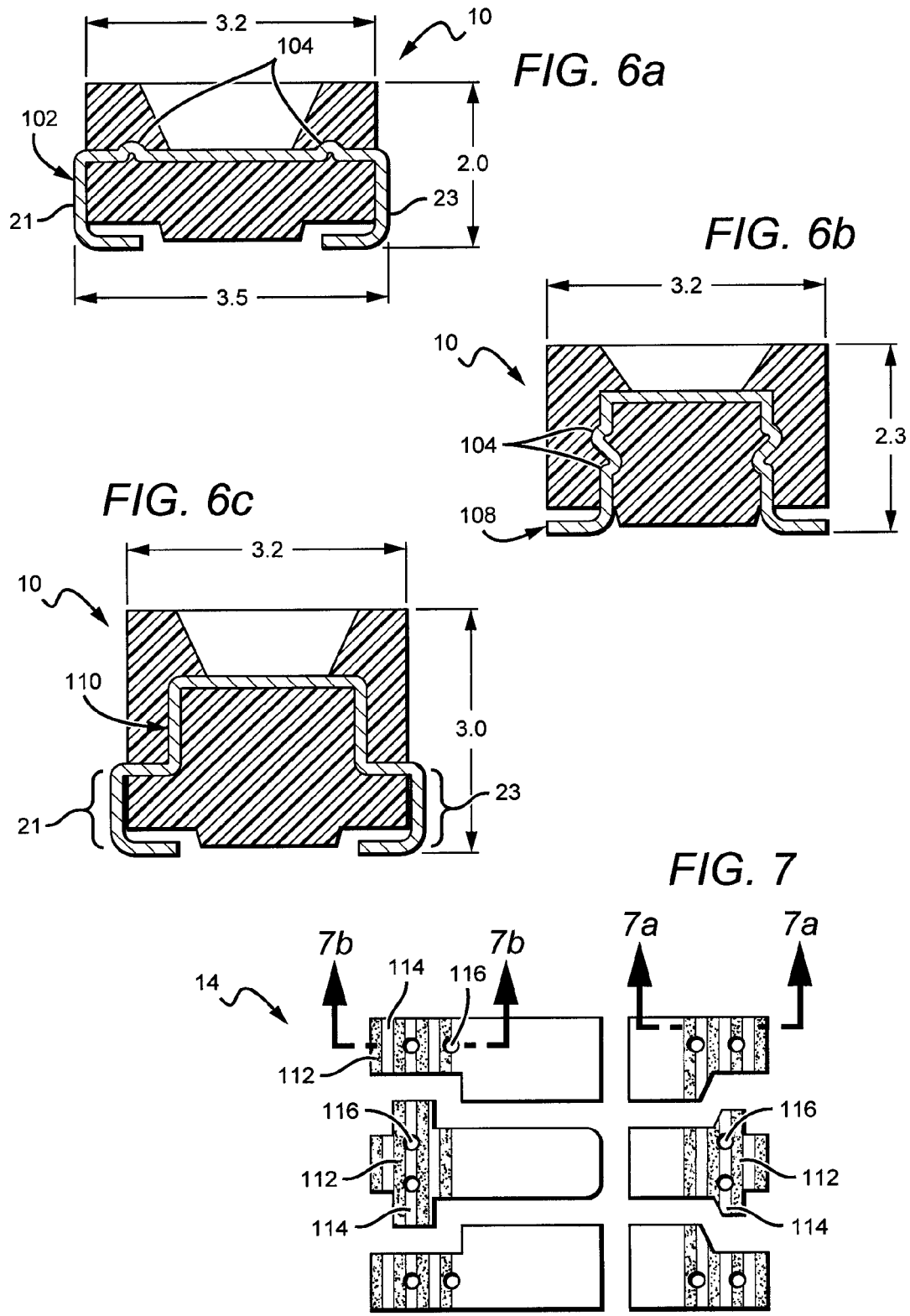

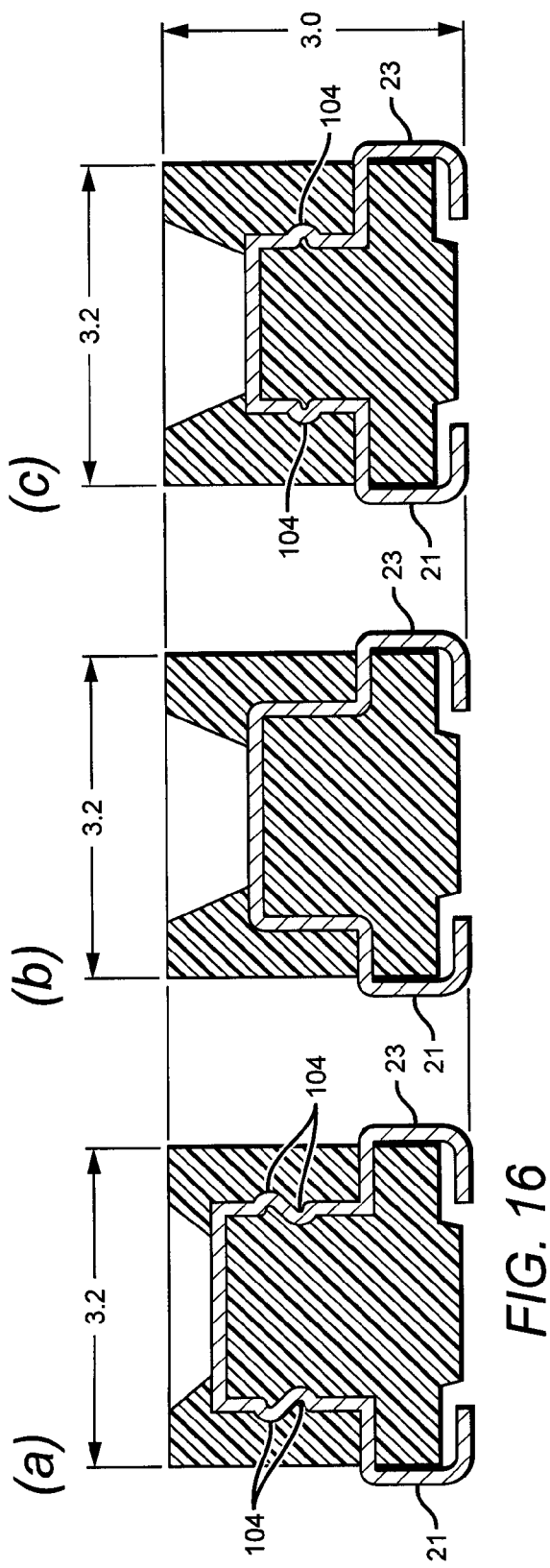
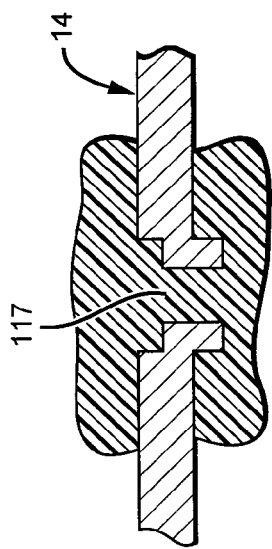
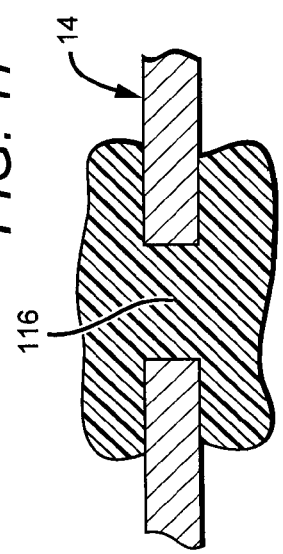

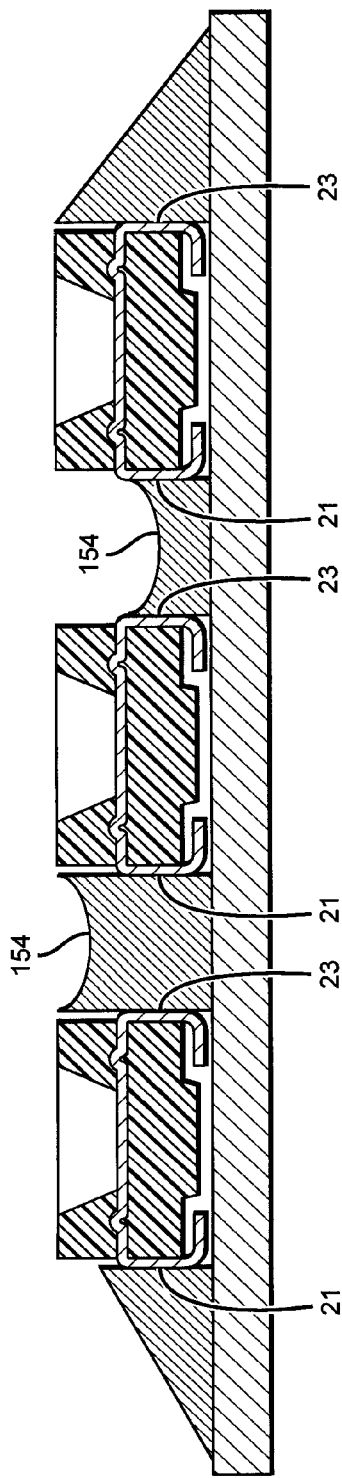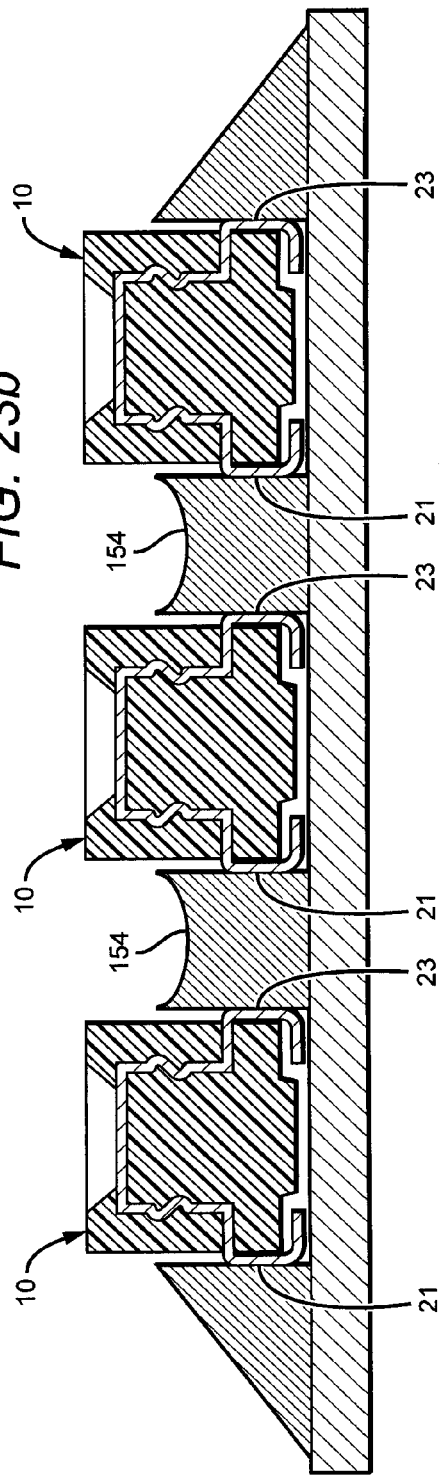

WATER RESISTANT SURFACE MOUNT DEVICE PACKAGE

This application claims the benefit of U.S. Provisional Patent Application Ser. No. 61/369,565, filed on Jul. 30, 2010.

BACKGROUND OF THE INVENTION

Field of the Invention

The present invention relates generally to electronic packaging, and more particularly to water resistant surface mount packaging having multiple emitters for outdoor displays.

Description of the Related Art

Light emitting diodes (LEDs) are solid state devices that convert electric energy to light, and generally comprise one or more active layers of semiconductor material sandwiched between oppositely doped layers. When a bias is applied across the doped layers, holes and electrons are injected into the active layer where they recombine to generate light. Light is emitted from the active layer and from all surfaces of the LED.

In recent years, there have been dramatic improvements in LED technology such that LEDs with increased brightness and color fidelity, smaller footprints, and overall improved emitting efficiency have been introduced. LEDs also have an increased operation lifetime compared to other emitters. For example, the operational lifetime of an LED can be over 50,000 hours, while the operational lifetime of an incandescent bulb is approximately 2,000 hours. LEDs can also be more resilient than other light sources while consuming less power. For these and other reasons, LEDs are becoming more popular; they are being used in more and more applications as an alternative to incandescent, fluorescent, halogen and other emitters.

Due at least in part to these improved LEDs and improved image processing technology, LEDs can be used as the light source for a variety of display types. In order to use LED chips in these types of applications, it is known in the art to enclose one or more LED chips in a package to provide environmental and/or mechanical protection, color selection, light focusing and the like. An LED package also includes electrical leads, contacts or traces for electrically connecting the LED package to an external circuit. The LED packages are commonly mounted on a printed circuit board (PCB).

Different LED packages can be used as the light source for outdoor displays of varying sizes, and are expected to withstand a variety of environmental conditions. These LED-based displays can comprise thousands of "pixels" or "pixel modules", each of which can contain a plurality of LEDs. The pixel modules can use high efficiency and high brightness LEDs that allow the displays to be visible from various distances and in a variety of environmental lighting conditions. The pixel modules can have as few as three or four LEDs that allow the pixel to emit many different colors of light from combinations of red, green, blue, and/or sometimes yellow light.

Most conventional LED based displays are controlled by a computer system that accepts an incoming signal (e.g. TV signal). Based on the color needed at the pixel module to form the overall display image, the computer system determines which LED(s) in each pixel module is to emit light, and how brightly. A power system can also be included that energizes each pixel module; the power to each of the LEDs can be modulated so light is emitted at the desired brightness. Conductors are provided to apply the appropriate power signal to each of the LEDs in the pixel modules.

LED-based displays are becoming more common in outdoor applications, and as their popularity increases, it is important for LED packages incorporated into such displays to withstand potentially harsh environmental conditions. The packages are expected to be robust and maintain their structural integrity during manufacture and use, but the integrity of such packages can become compromised. For example, in current packages in the art used for outdoor displays, separation between the package casing and the leads/lead frame can occur. Such separation can allow environmental contaminants such as water and dirt to enter the package, and can reduce the overall life of the package. Furthermore, the package structures can become deformed during the reflow process.

SUMMARY OF THE INVENTION

The present invention provides emitter packages and LED displays optimized for outdoor use, with the emitter packages being water resistant to withstand adverse environmental conditions. The emitter packages of the present invention have improved structural integrity, with the packages having suitable surface area for mounting a desired number of LED chips and corresponding components. Moreover, the present invention provides customizable emitter packages, which may allow for attachment to standardized mechanical/electrical supports.

One embodiment comprises an emitter package, with the package comprising a casing with a cavity extending into the interior of the casing from a top surface of the casing, an electrically conductive lead frame integral to the casing, and a plurality of light emitting devices arranged on conductive parts of the lead frame. The lead frame comprises features to enhance adhesion between the casing and the lead frame, with the material of the casing encompassing each of the features. The light emitting devices and portions of the lead frame are exposed through the cavity. The lead frame features enable the package to be substantially water resistant.

Pursuant to another embodiment, an emitter package is provided comprising a casing with a cavity extending into the interior of the casing from a top surface of the casing, an electrically conductive lead frame integral to the casing, and a plurality of light emitting devices arranged on portions of the lead frame exposed through the cavity. The lead frame comprises features to enhance adhesion between the casing and the lead frame. The lead frame also comprises a plurality of solder pins that each extend out at least one end surface of the casing and wrap around the bottom of the casing, with the length of the solder pins being less than the overall height of the package. The lead frame features enable the package to be substantially water resistant.

In accordance with yet another embodiment, an emitter package is provided comprising a casing with a cavity extending into the interior of the casing from a top surface of the casing, a lead frame integral to the casing, a plurality of light emitting devices arranged on a portion of the lead frame exposed through the cavity, and an encapsulant over the package and in the cavity. The lead frame comprises lead frame features enhancing the adhesion between the casing and the lead frame, with the casing material encompassing the lead frame features. The cavity comprises cavity features to enhance adhesion between the encapsulant and the cavity. The lead frame features and the cavity features enable the package to be substantially water resistant.

In yet another embodiment according to the present invention, a light emitting device display is provided, comprising a substrate carrying an array of emitter packages, and electrically connected drive circuitry to selectively energize the array for producing visual images on the display. Each of the emitter packages comprises a casing with a cavity extending into the interior of the casing from a top surface of the casing, a lead frame integral to the casing, and a plurality of LEDs arranged on the lead frame, with the LEDs and portions of the lead frame exposed through the cavity. The lead frame comprises features to enhance adhesion between the casing and the lead frame, with the features enabling each of the packages to be substantially water resistant.

These and other further features and advantages of the invention would be apparent to those skilled in the art from the following detailed description, taken together with the accompanying drawings, in which:

BRIEF DESCRIPTION OF THE DRAWINGS

FIG. 4 is an end elevation view of the embodiment shown in FIG. 1, with the opposite end being substantially similar;

FIG. 5 is a side elevation view of the embodiment shown in FIG. 1, with the opposite side being substantially similar;

FIGS. 6a-c are cross section views of the embodiment of FIG. 1 as seen along the line 6-6 in FIG. 1.

FIG. 7 is a top view of a lead frame in accordance with one embodiment that may be used in the device of FIG. 1;

FIG. 16 is a side view of various possible embodiments for a lead frame and casing according to the present invention;

FIG. 17 is a side view of one possible embodiment for a lead frame feature according to the present invention;

FIG. 18 is a side view of another possible embodiment for a lead frame feature according to the present invention;

FIG. 20a shows various possible cavity features of FIG. 20 as seen along the line 7a-7a;

FIG. 23a is a cross-sectional side view of a grouping of emitter packages with insufficient/irregular gel coverage in between the packages; and FIG. 23b is a cross-sectional side view of a grouping of emitter packages with gel coverage in between the packages.

DETAILED DESCRIPTION OF THE INVENTION

Figure 1:
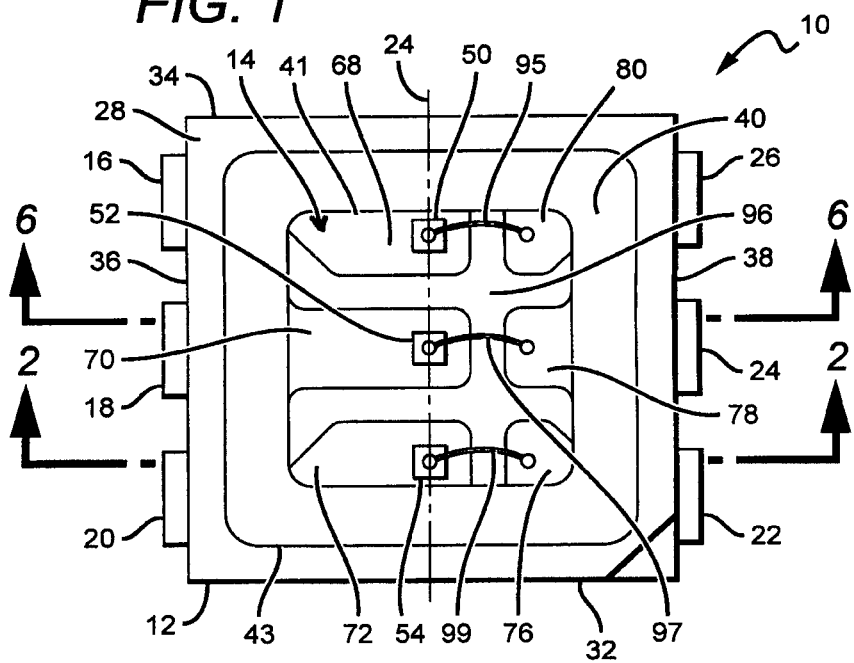
FIG. 1 is a top plan view of an emitter package according to the present invention.

The present invention is described herein with reference to certain embodiments, but it is understood that the invention can be embodied in many different forms and should not be construed as limited to the embodiments set forth herein.

In some embodiments according to the present invention, structures are provided for water resistant, multiple emitter packages that allow the packages to emit light in various environmental conditions by having improved package integrity. In some embodiments, the improved package integrity can be provided by having lead frames with different shapes. In other embodiments the improved package integrity can be provided by a lead frame with one or more features that improve the adhesion between the lead frame and the package casing. In still other embodiments, the different shapes can be combined with different lead frame features.

Many different lead frame features can be used and can comprise water retention features, or features that result in a circuitous or longer path length on the lead frame member, which presents a more difficult path for water to enter the package along the lead frame. The lead frame can comprise multiple different types of features, and in some embodiments different types of features can be included on a single lead frame member, and different lead frame members can have different features. In some embodiments the lead frame can comprise features on one plane of the lead frame, with features also included on a different lead frame plane. For example, a feature can be included on one plane (e.g vertical plane) of the lead frame, with the same or different features included on an orthogonal plane (e.g. horizontal plane). In some embodiments, the lead frame can have one or more features that extend the path for water in one lead frame plane, and can also have one more features that extent the path for water entering in another lead frame plane.

Many different lead frame features can be used in different embodiments including but not limited to the following: through-holes, cuts, bends, spot punches, indentations, tabs, steps, or metal gaps between adjacent portions of said lead frame. Some of these features can comprise holes of different sizes and shapes, some of which can pass through the lead frame member. In other embodiments, the features can comprise multiple holes placed randomly in patterns on the particular lead frame members, and in different embodiments the holes can be placed in the same or different locations on the various lead frame members. In those embodiments having holes, all or some of the holes can have stepped or have different shapes at different hole depths. Some of the features can also comprise sharp edges, with some of these features having perpendicular edges.

Moreover, some embodiments of the present invention provide water resistant emitter packages that further maintain structural integrity during use in potentially adverse conditions due in part to features in the package cavity that promote improved adhesion between the package cavity and a protective encapsulant. Such cavity features may include: roughening of the cavity surface, varying cavity shapes, and various shaped grooves around the circumference of the top of the cavity.

In some package embodiments, these lead frame features that resist water intrusion can also result in improved adhesion between the lead frame and the packages or encapsulating material that can fill or surround the different features. These features can provide the dual function of preventing water intrusion while at the same time providing for improved package adhesion and reliability.

Different packages embodiments according to the present invention have package cavities, with the emitters arranged in the cavity and emitting light from said cavity. In these embodiments, portions of the lead frame can be exposed in the cavity, with the lead frame features described above arranged around or in proximity to the cavity but not exposed in the cavity. In still other embodiments, all or some of the lead frame features can be exposed in the cavity.

In still other embodiments, the lead frame may comprise solder pins that exit the end surfaces of the package and wrap around the bottom of the package. The length of the solder pins at the sides of the package are less than the overall height of the package, which can help optimize pin coverage by a protective gel placed in between adjacent packages. Additionally, the shape of the package cavity can be customized such that the bottom of the cavity has a shape providing greater available surface area for the bonding of a desired number of diodes, while the top of the cavity may comprise a different shape to maximize light emission and viewing angle. This type of cavity allows for more diodes to be included in a package that would otherwise be too small and have too little surface area to carry the desired number of diodes.

The present invention is applicable to different types of emitter packages, such as surface mount devices (SMDs), which can be used in many different lighting applications such as LED color screens or decorative lighting. Different embodiments of emitter packages are described below that utilize light emitting diodes as their emitters, but it is understood that other emitter package embodiments can use different types of emitters.

It will be understood that when an element is referred to as being "on", "connected to", "coupled to", or "in contact with" another element, it can be directly on, connected or couple to, or in contact with the other element or intervening elements may be present. In contrast, when an element is referred to as being "directly on", "directly connected to", "directly coupled to", or "directly in contact with" another element, there are no intervening elements present. Likewise, when a first element is referred to as being "in electrical contact with" or "electrically coupled to" a second element, there is an electrical path that permits current flow between the first element and the second element. The electrical path may include capacitors, coupled inductors, and/or other elements that permit current flow even without direct contact between conductive elements.

Although the terms first, second, etc. may be used herein to describe various elements, components, regions, and/or sections, these elements, components, regions, and/or sections should not be limited by these terms. These terms are only used to distinguish one element, component, region, or section from another element, component, region, or section. Thus, a first element, component, region, or section discussed below could be termed a second element, component, regions, or section without departing from the teachings of the present invention.

Embodiments of the invention are described herein with reference to cross-sectional view illustrations that are schematic illustrations of embodiments of the invention. As such, the actual thickness of components can be different, and variations from the shapes of the illustrations as a result, for example, of manufacturing techniques and/or tolerances are expected. Embodiments of the invention should not be construed as limited to the particular shapes of the regions illustrated herein but are to include deviations in shapes that result, for example, from manufacturing. A region illustrated or described as square or rectangular will typically have rounded or curved features due to normal manufacturing tolerances. Thus, the regions illustrated in the figures are schematic in nature and their shapes are not intended to illustrate the precise shape of a region of a device and are not intended to limit the scope of the invention.

Figure 2:
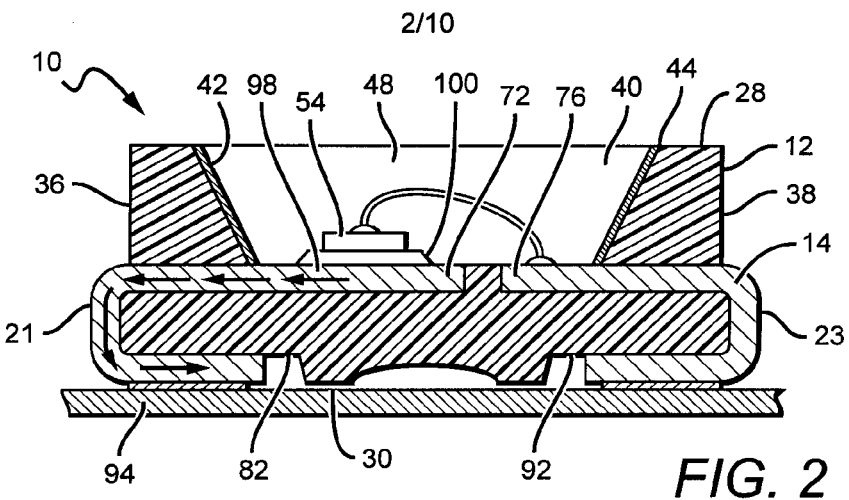
FIG. 2 is a cross section view of the embodiment of FIG. 1 as seen along the line 2-2 in FIG. 1.

FIGS. 1 and 2 show one embodiment of a water resistant, multiple emitter package 10 according to the present invention that comprises an SMD. As mentioned above, it is understood that the present invention can be used with other types of emitter packages beyond SMDs. The package 10 can comprise a casing 12 that carries an integral lead frame 14. The lead frame 14 can comprise a plurality of electrically conductive connection parts used to conduct electrical signals to the package's light emitters. The lead frame may also assist in dissipating heat generated by the emitters in applications where a significant amount of heat is produce by the package's emitters.

The lead frame 14 can be arranged in many different ways and different numbers of parts can be utilized in different package embodiments. The package 10 is described below utilizing three emitters, and in the embodiment shown, the lead frame is arranged so each of the emitters is driven by a respective electrical signal. Accordingly, there are six conductive parts in the embodiment shown, comprising a pair of conductive parts for each emitter with an electrical signal applied to each of the emitters through its conductive part pair. For the package 10, the conductive parts comprise first, second and third anode parts 16, 18, 20, and first, second and third cathode parts 22, 24, 26, each having an emitter attach pad. However, it is understood that some embodiments can comprise less than three LEDs, while others can comprise less than six LEDs and still others can comprise more than three LEDs. The LEDs in these various embodiments can each have their own respective conductive part pair, or can share conductive parts with other LEDs. The cost and complexity of the packages can be generally lower with fewer LED chips.

The casing 12 can have many different shapes and sizes, and in the embodiment shown is generally square or rectangular, with upper and lower surfaces 28 and 30, side surfaces 32 and 34 and end surfaces 36 and 38. The upper portion of the casing further comprises a recess or cavity 40 extending from the upper surface 28 into the body of the casing 12 to the lead frame 14. Emitters are arranged on the lead frame such that light from the emitters emits from the package 10 through the cavity 40. In some embodiments, a reflector component such as a reflective insert or ring (shown in FIG. 2) may be positioned and secured along at least a portion of a side or wall 44 of the cavity 40. The effectiveness of the reflectivity of the ring 42 and the emission angle of the package can be enhanced by tapering the cavity 40 and ring 42 carried therein inwardly toward the interior of the casing.

The effectiveness of a reflector component (if included) and the emission angle of the package can be enhanced by tapering the cavity 40 and reflector component carried therein inwardly toward the interior of the casing. By way of example and not by limitation, a cavity angle of ~90.0 degrees may provide for a suitable and desired viewing angle as well as the desired reflectivity if a reflector component is included. In another possible embodiment, a cavity angle of ~50.0 degree may provide for a suitable and desired viewing angle. In still other possible embodiments, a cavity angle of less than 90.0 degrees, greater than 90.0 degrees, between 50.0-90.0 degrees, and/or less than 50.0 degrees may provide for suitable and desirable viewing angles.

Moreover, the depth of cavity 40 can be customized to alter the viewing angle of the package. By way of example and not limitation, a cavity 40 depth ranging from 0.8 mm to 1.7 mm may provide a desirable viewing angle. In another possible embodiment, a cavity depth of less than 0.8 mm may provide a desired viewing angle. In still other possible embodiments, a cavity depth of greater than 1.7 mm but less than the overall height of the emitter package may provide a desired viewing angle. It is understood that generally, the deeper the cavity is, the smaller the resulting viewing angle is, and the shallower the cavity is, the greater the resulting viewing angle is. Accordingly, the depth of the cavity will be at least dependent on the desired end use of the emitter package.

Figure 1A:
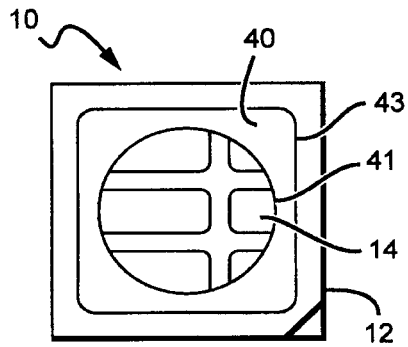
FIGS. 1a-c are top plan views of different cavities for an emitter package according to the present invention.
Figure 1B:
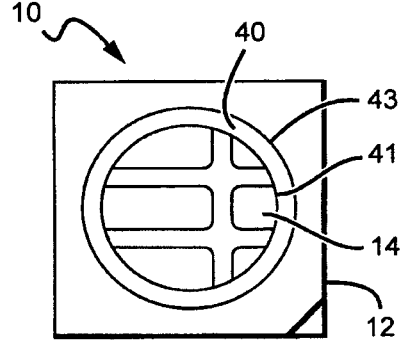
Figure 1C:
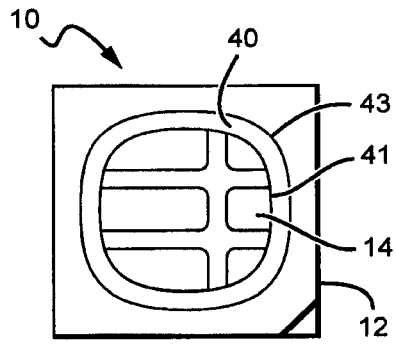

The cavity shape of the package may vary among various possible embodiments, and in some embodiments, the bottom portion 41 of the cavity 40 adjacent the exposed portions of the lead frame 14 may comprise a different shape than the top portion 43 of the cavity 40. In the embodiment shown in FIG. 1, both the top portion 43 and bottom portion 41 of cavity 40 are defined by a rectangular shape. FIG. 1a depicts a cavity with a top portion 43 similar to that of FIG. 1, whereas the bottom portion 41 is a circle. FIG. 1b depicts a cavity with circular top and bottom portions 43 and 41, respectively. FIG. 1c depicts a cavity with a circular top portion 43, with the bottom portion 41 defined by a shape comprising four arcs, with the shape resembling a square with curved sides. The four arcs can have a different radius of curvature than the circular top section, and in the embodiment shown the arc radius of curvature can be larger than the circular top section. It is understood that bottom and top portions 41, 43 may comprise any variety of suitable shapes according to the present invention. The rectangular and four-arc shapes of the bottom portion 41 in FIGS. 1 and 1c allow for more of lead frame 14 to be exposed through cavity 40 compared to cavities comprising a circular shape at the bottom bottom, which increases the available, exposed surface area of lead frame 14 upon which various types of LEDs or other diodes may be mounted. Increasing the available lead frame 14 surface area exposed in the cavity 40 may be necessary in particularly small emitter packages, which in the absence of a suitable shape for bottom portion 41, may not be able to fit a desired number of mounted diodes or other device components.

In some embodiments, the cavity 40 may be at least partially filled with an encapsulant 48 that can protect and positionally stabilize the lead frame 14 and the emitters carried thereby (see FIG. 2). In some instances, the encapsulant 48 may completely cover the emitters and the portions of the lead frame 14 exposed through the cavity 40. The encapsulant 48 may be selected to have predetermined optical properties to enhance the projection of light from the LEDs, and in some embodiments is substantially transparent to the light emitted by the package's emitters. The encapsulant 48 may be substantially flat along its top surface, can be shaped (such as into a hemisphere or bullet shape), or can be fully or partially concave in the cavity 40. The encapsulant 48 may be formed from a silicone, resin, an epoxy, a thermoplastic polycondensate, glass, and/or other suitable materials or combinations of materials. In some embodiments, materials may be added to the encapsulant 48 to enhance the emission, absorption and/or dispersion of light to and/or from the LEDs.

The casing 12 may be fabricated of material that is electrically insulating; it may also be thermally conductive. Such materials are well-known in the art and may include, without limitation, thermoplastic polycondensates (e.g., a polyphthalamide (PPA)), certain ceramics, resins, epoxies, and glass. The casing 12 may also be formed of dark or black material(s) to improve contrast in image generation SMD packages, such as with SMDs employed in video displays.

Figure 3:
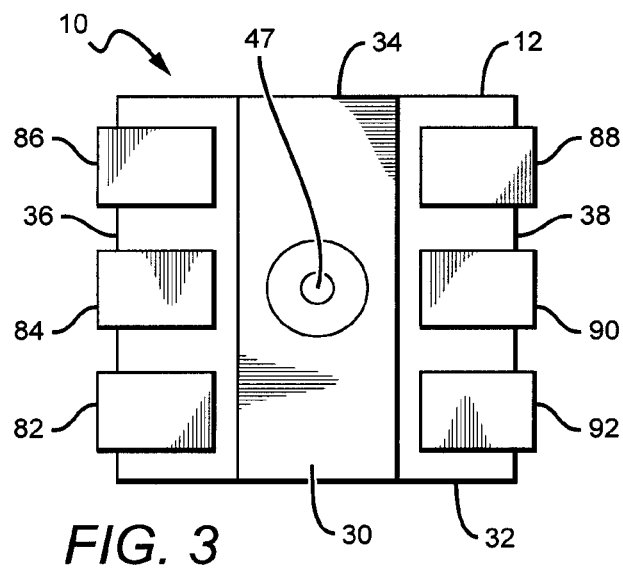
FIG. 3 is a bottom view of the embodiment shown in FIG. 1.
Figure 4:
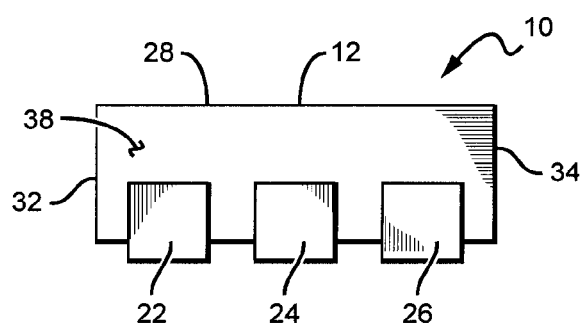
Figure 5:
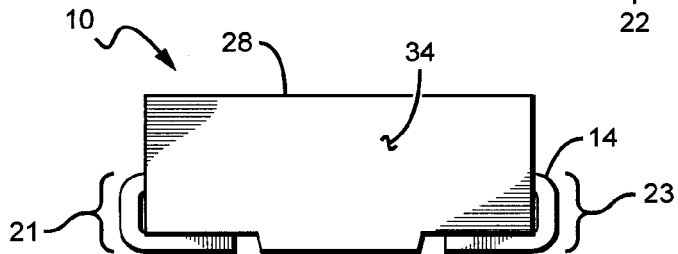

The package 10 and its casing 12 may be formed and/or assembled through any one of a variety of known methods as is known in the art. For example, the casing 12 may be formed or molded around the anode parts 16, 18, 20 and cathode parts 22, 24, 26, such as by injection molding. The hole 47 shown in FIG. 3 may be present in packages formed by known injection molding techniques, as it represents the point of entry for casing material to be injection molded over said lead frame 14. Alternatively, the casing may be formed in sections, for example, top and bottom sections, with the anode parts 16, 18, 20 and cathode parts 22, 24, 26 formed on the bottom section. The top and bottom sections can then be bonded together using known methods and materials, such as by an epoxy, adhesive or other suitable joinder material.

In the illustrative embodiment depicted, the package 10 utilizes first, second and third LEDs 50, 52, 54, each of which can emit the same color of light or different color of light than the others. In the embodiment shown, the LEDs 50, 52, 54 emit blue, red, and green colors, respectively, so that when appropriately energized the LEDs produce, in combination, a substantially full range of colors. Further, when appropriately energized, the LEDs 50, 52, 54 can emit a white light combination of different color temperatures. It is understood that more or less than three LEDs can be utilized in a package according to the present invention, with the LEDs emitting any desired color or color combination. It is also understood that driving signals of different levels can be applied to the different LEDs 50, 52, 54 through their respective anode and cathode parts so that the different LEDs 50, 52, 54 can emit light at different intensities.

The package 10 can also comprise elements to protect against damage from electrostatic discharge (ESD). Different elements can be used such as various Zener diodes (not shown), different LEDs arranged in parallel and reverse biased to the LED chips 50, 52, 54 (not shown), surface mount varistors (not shown), and lateral Si diodes (not shown). In embodiments using a Zener diode, it can be mounted to a separate attach pad using known mounting techniques. When utilizing groups of LEDs coupled in series, only one ESD element is needed for each series group.

Many different LEDs can be used in packages according to the present invention, and LED structures, features, and their fabrication and operation are generally known in the art and only briefly discussed herein. LEDs can have many different semiconductor layers arranged in different ways and can emit different colors. The layers of the LEDs can be fabricated using known processes, with a suitable process being fabrication using metal organic chemical vapor deposition (MOCVD). The layers of the LED chips generally comprise an active layer/region sandwiched between first and second oppositely doped epitaxial layers, all of which are formed successively on a growth substrate or wafer. LED chips formed on a wafer can be singulated and used in different application, such as mounting in a package. It is understood that the growth substrate/wafer can remain as part of the final singulated LED or the growth substrate can be fully or partially removed.

It is also understood that additional layers and elements can also be included in the LEDs, including but not limited to buffer, nucleation, contact and current spreading layers as well as light extraction layers and elements. The active region can comprise single quantum well (SQW), multiple quantum well (MQW), double heterostructure or super lattice structures.

The active region and doped layers may be fabricated from different material systems, with one such system being Group-III nitride based material systems. Group-III nitrides refer to those semiconductor compounds formed between nitrogen and the elements in the Group III of the periodic table, usually aluminum (Al), gallium (Ga), and indium (In). The term also refers to ternary and quaternary compounds such as aluminum gallium nitride (AlGaN) and aluminum indium gallium nitride (AlInGaN). In a possible embodiment, the doped layers are gallium nitride (GaN) and the active region is InGaN. In alternative embodiments the doped layers may be AlGaN, aluminum gallium arsenide (AlGaAs) or aluminum gallium indium arsenide phosphide (AlGaInAsP) or aluminum indium gallium phosphide (AlInGaP) or zinc oxide (ZnO).

The growth substrate/wafer can be made of many materials such as silicon, glass, sapphire, silicon carbide, aluminum nitride (AlN), gallium nitride (GaN), with a suitable substrate being a 4H polytype of silicon carbide, although other silicon carbide polytypes can also be used including 3C, 6H and 15R polytypes. Silicon carbide has certain advantages, such as a closer crystal lattice match to Group III nitrides than sapphire and results in Group III nitride films of higher quality. Silicon carbide also has a very high thermal conductivity so that the total output power of Group-III nitride devices on silicon carbide is not limited by the thermal dissipation of the substrate (as may be the case with some devices formed on sapphire). SiC substrates are available from Cree Research, Inc., of Durham, N.C. and methods for producing them are set forth in the scientific literature as well as in a U.S. Pat. Nos. Re. 34,861; 4,946, 547; and 5,200,022.

LEDs can also comprise additional features such as conductive current spreading structures, current spreading layers, and wire bond pads, all of which can be made of known materials deposited using known methods. Some or all of the LEDs can be coated with one or more phosphors, with the phosphors absorbing at least some of the LED light and emitting a different wavelength of light such that the LED emits a combination of light from the LED and the phosphor. LED chips can be coated with a phosphor using many different methods, with one suitable method being described in U.S. patent application Ser. Nos. 11/656,759 and 11/899,790, both entitled "Wafer Level Phosphor Coating Method and Devices Fabricated Utilizing Method", and both of which are incorporated herein by reference. Alternatively, the LEDs can be coated using other methods such as electrophoretic deposition (EPD), with a suitable EPD method described in U.S. patent application Ser. No. 11/473, 089 entitled "Close Loop Electrophoretic Deposition of Semiconductor Devices", which is also incorporated herein by reference.

Furthermore, LEDs may have vertical or lateral geometry as is known in the art. Those comprising a vertical geometry may have a first contact on a substrate and a second contact on a p-type layer. An electrical signal applied to the first contact spreads into the n-type layer and a signal applied to the second contact spreads into a p-type layer. In the case of Group-III nitride devices, it is well known that a thin semitransparent typically covers some or the entire p-type layer. It is understood that the second contact can include such a layer, which is typically a metal such as platinum (Pt) or a transparent conductive oxide such as indium tin oxide (ITO).

LEDs may also comprise a lateral geometry, wherein both contacts are on the top of the LEDs. A portion of the p-type layer and active region is removed, such as by etching, to expose a contact mesa on the n-type layer. A second lateral n-type contact is provided on the mesa of the n-type layer. The contacts can comprise known materials deposited using known deposition techniques.

In the illustrative embodiment shown, the lead frame's anode and cathode parts 16, 18, 20, 22, 24, 26 project outwardly through the opposed surfaces 36 and 38 of the casing 12. Anode parts 16, 18, 20 extend from surface 36, and cathode parts 22, 24, 26 extend from surface 38. The anode and cathode parts are arranged to operate in pairs to conduct an electrical signal to their respective light emitter when the package 10 is surface mounted for operation. In the embodiment shown, the anode and cathode parts 16, 18, 20, 22, 24, 26 are bent orthogonally to extend outside of and down along their end surfaces 36 and 38 of the casing, then bent orthogonally again to form end portions 82, 84, 86, 88, 90, 92 that extend along the lower surface 30 of the casing 12. The outwardly facing surfaces of the end portions 82, 84, 86, 88, 90, 92 of the leads are substantially flush with the bottom of the casing 12 to facilitate connection with an underlying mechanical and/or electronic support structure 94 such as a PCB.

As best shown in FIGS. 2, 5, 6*a*, 6*c*, 16, 19, 21-22, and 23*a-b*, the portions of anode parts 16, 18, 20 and cathode parts 22, 24, 26 exposed along the outside length of surfaces 36 and 38 will be collectively referred to as solder pins 21, 23. The length of the solder pins 21, 23 can be customized to alter the amount of the lead frame 14 that will be exposed at the end surfaces 36, 38 of a package. As discussed in more detail below, some package embodiments will preferably minimize the length of the solder pins 21, 23 so as to minimize the area of the lead frame exposed through the end surfaces and/or to accommodate a thin/low profile package. By way of example and not limitation, solder pin 21, 23 length ranging from 1.0 mm to 1.5 mm may be desirable. In another possible embodiment, solder pin 21, 23 length of less than 1.0 mm may be desirable. In still other possible embodiments, solder pin 21, 23, length of greater than 1.5 mm but less than the overall height of the emitter package may be desirable. It may also be desirable for the solder pin 21, 23 length to be less than half the overall height of the package, or less than the height of the package from bottom surface to the bottom of the cavity 40.

As best shown in FIG. 2, the end portions 82, 84, 86, 88, 90, 92 (with only end portions 82, 92 being visible) of the leads can be electrically connected or bonded to traces or pads on the support structure 94 using any of a number of well-known connection techniques, including soldering. It is understood that in other embodiments all or some of the end portions 82, 84, 86, 88, 90, 92 can be bent in an opposite direction while still allowing for surface mounting.

The cathode parts 22, 24, 26 comprise central surfaces or mounting pads 68, 70, 72 for carrying the LED chips 50, 52, 54 in a linear array that extends in a direction 74 perpendicular to the side surfaces 32 and 34, with the LEDs 50, 52, 54 being aligned generally along a central axis of the casing 12. This alignment allows for improved color uniformity at different horizontal viewing angles compared to packages having LEDs arranged in other ways, such as in a cluster. It is understood that a linear array extending in a direction perpendicular to side surfaces 36, 38 would allow for improved color uniformity at different vertical viewing angles. However, it is also understood that the LEDs do not have to be linearly aligned, and can be arranged in any desired manner on the mounting portions of the lead frame.

Mounting pads 68 and 78 may extend toward the center of the casing 12, which allows for the LEDs 50, 54 to be mounted closer to the center of the casing 12 so they can emit out of the cavity 40. The anode parts 16, 18, 20 include electrical connection pads 76, 78, 80, respectively, positioned adjacent to, but spaced apart from, the mounting pads 68, 70, 72 via gap 96. Connection pads 76 and 80 extend toward the center of the casing 12 to allow for electrical connection to LED 50, 54 that are mounted closer to the center of the casing 12 by extensions of mounting pads 68, 70.

The anode parts 16, 18, 20 run generally parallel to one another and cathode parts 22, 24, 26 run generally parallel to one another as well, with all extending in a direction perpendicular to the direction 74 of the LED array. It is understood that in other embodiments the anode parts and cathode parts need not run parallel to one another. The leads can have different widths and can be small enough that when the package 10 is viewed from the top, they are minimally visible or not visible. Additionally and/or alternatively, the leads may be obstructed from view from the top by the casing 12.

As best seen in FIG. 2, the cavity 40 extends into the casing interior a sufficient depth to expose the attach and connection pads 68, 70, 72, 76, 78, 80. In a possible embodiment, each of the LEDs 50, 52, 54 has its own pair of contacts or electrodes arranged so that when an electrical signal is applied across the contacts, the LED emits light. The contacts of the LEDs are electrically connected to an anode and cathode part pair. Ensuring that each of the LEDs 50, 52, 54 has its own cathode and anode pair can be advantageous for a number of reasons, such as providing easier electrical control of each LED.

In accordance with a typical implementation of the embodiments shown, one of the contacts of LEDs 50, 52, 54 is coupled to the chip carrier pads 68, 70, 72, while the other of LEDs 50, 52, 54 contacts is coupled to the pads 76, 78, 80. However, it is understood that pads 76, 78, 80 can carry the chips instead, with pads 68, 70, 72 being electrically connected to pads 76, 78, 80. Different known structures and methods can be used for making this connection, with one such structure being wire bonds 95, 97, 99 applied using known methods. Although one possible wire bond configuration is shown, it is understood that various, other suitable wire bond configurations are possible depending on the structure of each chip. For example, there may be more than one wire bonds on one chip, with one wire bond attached to a connection pad, and the other wire bond attached to a chip carrier pad.

The anode parts 16, 18, 20 and cathode parts 22, 24, 26 may be made from an electrically conductive metal or metal alloy, such as copper, a copper alloy, and/or other suitable electrically conductive, low resistivity, corrosion resistant materials or combinations of materials. As noted, the thermal conductivity of the leads may assist, to some extent, in conducting heat away from the LEDs 50, 52, 54 carried by the SMD as shown by the arrows 98. However, in lower power packages (such as those operating at ~20-60 mA) of the present embodiment, thermal management may not be a key concern.

Each of the LEDs 50, 52, 54 may be electrically coupled with its one the pads 68, 70, 72 by means of an electrically and thermally conductive bonding material 100 such as a solder, adhesive, coating, film, encapsulant, paste, grease and/or other suitable material. In one embodiment, the LEDs may be electrically coupled and secured to their respective pads using a solder pad on the bottom of the LEDs. The fabrication of the anode parts 16, 18, 20 and cathode parts 22, 24, 26 may be accomplished by stamping, injection molding, cutting, etching, bending or through other known methods and/or combinations of methods to achieve the desired configurations. For example, the anode parts and/or cathode parts can be partially metal stamped (e.g., stamped simultaneously from a single sheet of relevant material), appropriately bent, and finally fully separated following the formation of some or all of the casing.

In some methods of manufacturing the LEDs may be coupled to the pads 68, 70, 72 prior to molding and/or assembling the casing 12 about the connection pads. Alternatively, the LEDs may be coupled to the pads 68, 70, after the anode and cathode parts have been partially encased within the casing. The cavity 40 that extends into the casing may be configured, such as by a differently shaped bottom portion 41, so that sufficient portions of the pads 68, 70, 72 and pads 76, 78, 80 are exposed to receive the LEDs and the associated wire bonds, and to allow the LEDs to emit light out through the cavity 40.

In conventional packages, the smooth surfaces and narrow paths between the lead frame's various parts and the various portions of the casing make reliable adhesion between the lead frame and the casing difficult. These mating smooth surfaces of the lead frame and casing and the narrow paths of casing material between the metal gaps of the lead frame can reduce the integrity of the emitter package structure, which can cause separation of the casing from the lead frame during both use and manufacturing processes such as reflow. Separations between the lead frame and casing can increase the chances of foreign contaminant infiltration (such as water, air or dirt), especially when the packages are used outdoors or in other locations susceptible to adverse environmental conditions. Such infiltration can increase the chances of component failure, which can increase the overall cost of using LEDs in outdoor applications.

To improve the structural integrity of an emitter package and make it more resistant to water (and other contaminants), the adhesion reliability between the casing and lead frame is enhanced. This can be accomplished via a variety of lead frame features, all of which enable the casing material to better encompass the lead frame and thus provide better adhesion between the two. FIGS. 6a-c depict various possible embodiments for overall shapes for lead frames according to the present invention. These shapes provide varying amounts of lead frame surface area, which the casing material may encompass to improve the structural integrity of the overall package. While these figures show various, possible lead frame shape configurations, it is understood that various other shapes and/or variations of the shown shapes are contemplated by the present invention.

FIG. 6a depicts a U-leg lead frame 102. By way of example and not limitation, the U-leg 102 package may be 2.0 mm high, 3.2 mm wide at its topmost surface, and 3.5 mm wide at its bottommost surface. The U-leg represents a lead frame configuration commonly seen in emitter packages, which is desirable for packages that must conform to conventional sizing requirements and/or fit with conventional mounts such as PCBs. However, various advantageous features may be applied to the U-leg configuration, many of which will be discussed in more detail below.

Figure 8:
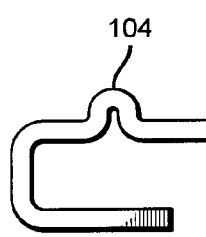
FIG. 8 is a side elevation view of one possible embodiment of a lead frame according to the present invention.
Figure 9:
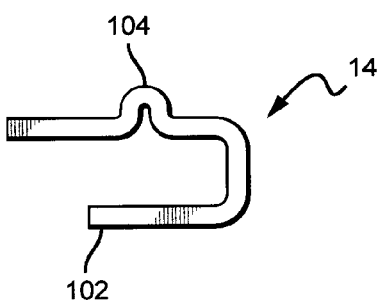
FIG. 9 is a side elevation view of another possible embodiment of a lead frame according to the present invention.

One possible such feature is shown in FIGS. 6a and 8, and is represented by U-bends 104. The U-bends 104 may be placed at any location on the U-leg lead frame 102 or any other type of lead frame contemplated by the present invention, and may occur in any desired number or configuration, alone, or in combination with other features as discussed below. The U-bends 104 create additional texture and surface area which the casing 12 may encompass and bond with. Additionally or alternatively, half-cuts 106 (as shown in FIG. 9) may be placed at any location on the U-leg 102 or any other possible lead frame, and may occur in any desired number or configuration, alone, or in combination with other features. Like the U-bends 104, half-cuts 106 provide texture and additional surface area to which the casing 12 may bond with.

FIG. 6b shows another lead frame configuration referred to as an L-leg lead frame 108. By way of example and not limitation, the L-leg 108 package may be 2.3 mm high and 3.2 mm wide at both its topmost and bottommost surfaces. Like the U-leg 102, the L-leg 108 may comprise any number of additional features to enhance the adhesion between the casing and the lead frame (as discussed in more detail below). As shown, the L-leg 108 may comprise U-bends 104 and the U-bends 104 may also be half-cuts as described below. The L-leg 108 does not comprise solder pins 21, 23 that extend along the outside of the end surfaces of the package. Instead, the L-leg 108 extends outside of the package only at its bottom surface 30. This can be advantageous as it provides fewer lead frame portions that may be exposed to external contaminants (when compared to lead frames having exposed solder pins). However, the L-leg 108 shape may necessitate a package with a greater height than, for example, a U-leg lead frame, which may be disadvantageous for packages in which a lower/thinner profile is desired.

FIG. 6c shows another possible lead frame embodiment referred to as an S-leg lead frame 110. By way of example and not limitation, the S-leg 110 package may be 3.0 mm high, 3.2 mm wide at its topmost portion, and 3.5 mm wide at its bottommost portion. As with the U-leg 102 and the L-leg 108 and as described in more detail below, the S-leg 110 may comprise any number and combination of additional features to enhance the adhesion between the casing and the lead. The S-leg 110 generally provides more bonding surface area than a traditional lead frame; this additional surface area can also aid in improved thermal management. Due to the additional height of the S-leg 110 configuration, the overall height of the package may be increased, which may be undesirable for lower profile/thinner applications.

Figure 7A:
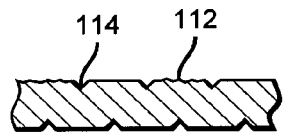
FIG. 7a is a cross section view of the embodiment of FIG. 7 as seen along the line 7a-7a in FIG. 7.
Figure 7B:
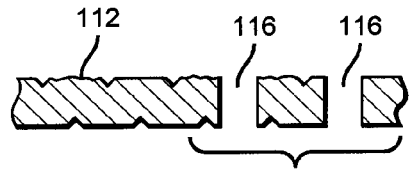
FIG. 7b is a cross section view of the embodiment of FIG. 7 as seen along the line 7b-7b in FIG. 7.

As mentioned above, various additional features may be used in the lead frames to improve adhesion between the casing and the lead frame, which improves the overall structural integrity of the emission package. Such features may include through-holes, cuts of different depths, bends, spot punches, projections, indentations, tabs, steps, or metal gaps between adjacent portions of said lead frame, although other features are contemplated. FIGS. 7 and 7a-b depict several of these features in one possible configuration; other configurations are contemplated by the present invention. Spot punches 112 may be applied to various surfaces of the lead frame 14. The spot punches 112 roughen the surface of the lead frame, which helps the casing material adhere to the lead frame. V-cuts 114 of different depths (including half cuts) may also be cut into various portions of the lead frame 14 on its upper and lower surfaces, which provide ruts for the casing material to fill in. It is understood that cuts comprising different shapes may also be used within the scope of the present invention. Additionally, through-holes 116 may be provided in various places along the lead frame. The casing material can fill the various through-holes 116, and provide a robust connection between the casing and the lead frame. The through-holes 116 in FIG. 7 are shown as circles, but it is understand that any shape is possible. By way of example and not limitation, FIGS. 11a-g show various U-leg lead frames 14 each comprising a different shape of through-hole 116, some of which can be stepped at different depths. The figures respectively show a stepped circles 118, crosses 120, stars 122, stepped crosses 124, ovals 126, triangles 128, and squares 130. Other common shapes such as polygons, rectangles, hexagons, and the like are also possible. Varying shapes of through-holes 116 can be used either alone or in any combination at various places on a lead frame.

Figure 10:
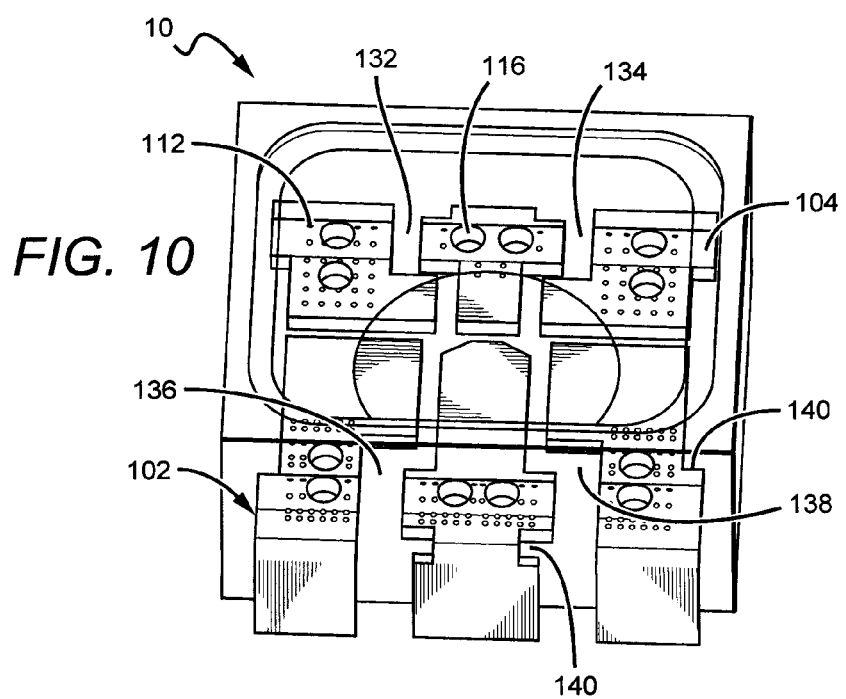
FIG. 10 is a perspective view of one possible embodiment for an emitter package according to the present invention.
Figure 11A:
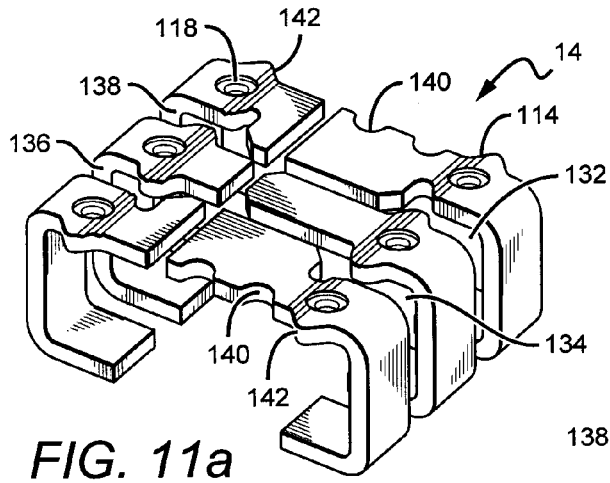
FIGS. 11a-g are perspective views of various lead frame embodiments that may be used in the emitter package of FIG. 10.
Figure 11B:
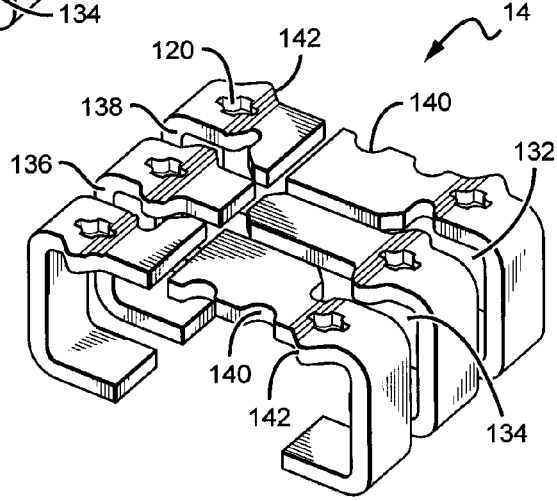
Figure 11C:
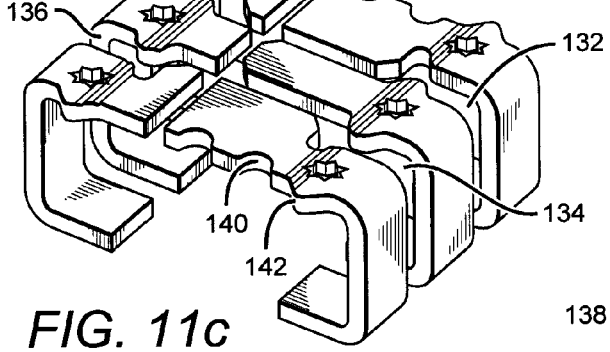
Figure 11D:
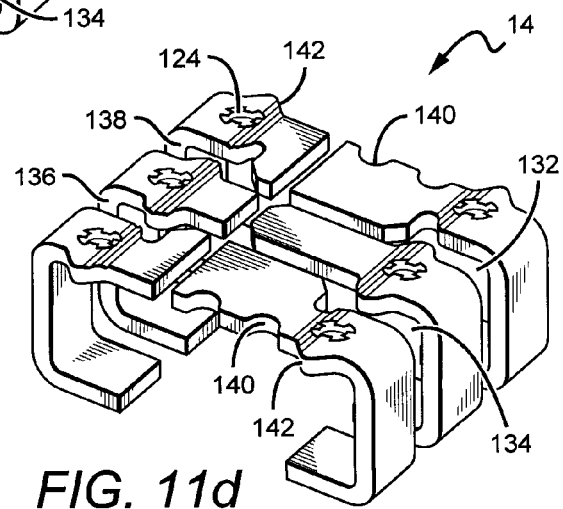
Figure 11E:
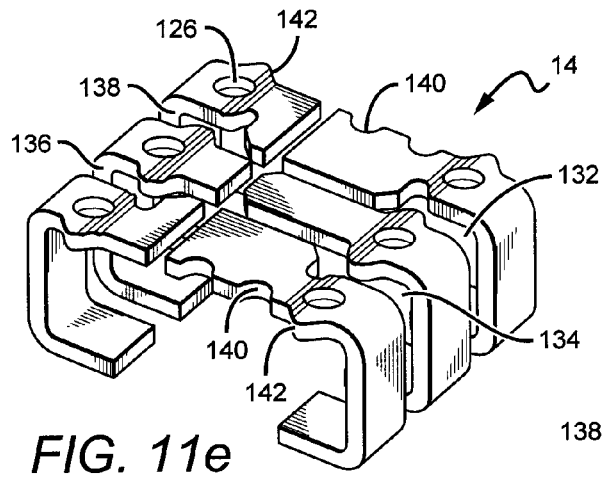
Figure 11F:
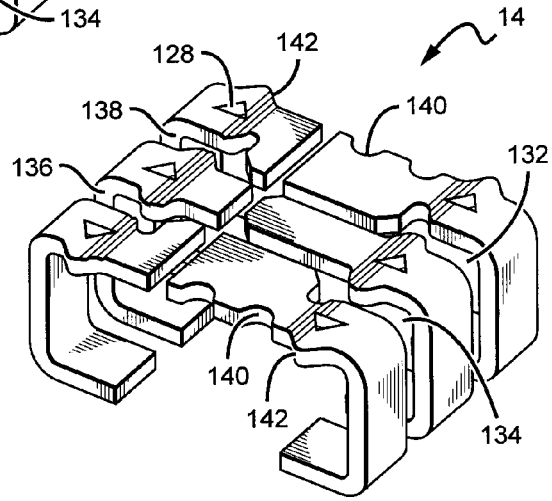
Figure 11G:
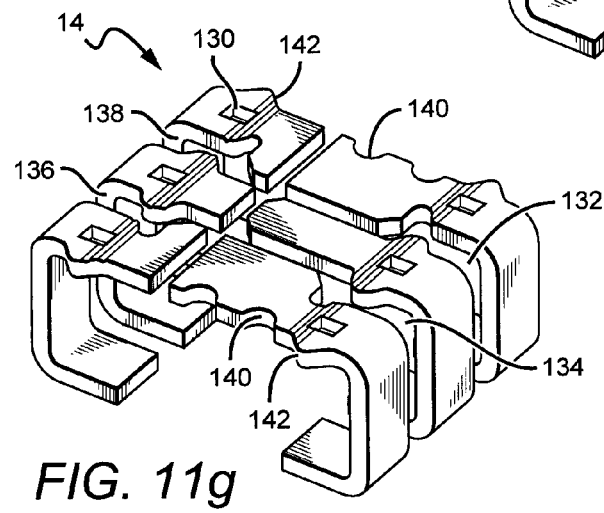

FIG. 10 depicts another U-leg 102 lead frame embodiment according to the present invention. The lead frame comprises a variety of lead frame features to improve adhesion between it and the casing, including spot punches 112, U-bends 104, through-holes 116, metal gaps 132, 134, 136, 138, and indentations 140. The metal gaps 132, 134, 136, and 138 may be provided at various locations between adjacent anode parts and adjacent cathode parts, with these gaps having greater and varying widths than the narrow paths seen in conventional emitter packages. The gaps are later filled with casing material to form thicker paths and/or path segments between these lead frame portions compared to packages not comprising the larger metal gaps; these wide paths and/or path segments can improve the adhesion between the casing and lead frame and improve the overall structural integrity/robustness of the package. The indentations 140 may be provided anywhere along the lead frame, and provide additional surface area along the lead frame to which the casing material may bond.

FIGS. 11a-11g, in addition to exhibiting a variety of different through-hole 116 types, also demonstrate how a variety of different features may be included on each lead frame. For example, the figures show the metal gaps 132, 134, 136, 138, indentations 140 along various parts of the lead frames, possible v-cuts 114, bent portions, and stepped portions 142. Stepped portions 142 may occur anywhere along the lead frame, and in addition to improving the adherence between the lead frame and casing, they may also make it more difficult for any moisture or other environmental contaminants that may have infiltrated the package to reach the light emitting devices. The various other lead frame features may provide this advantage as well.

Figure 13:
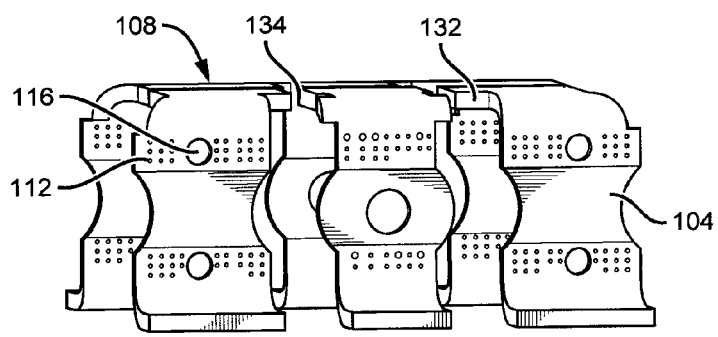
FIG. 13 is a side perspective view of a possible lead frame that may be used in the emitter package of FIG. 12.
Figure 12:
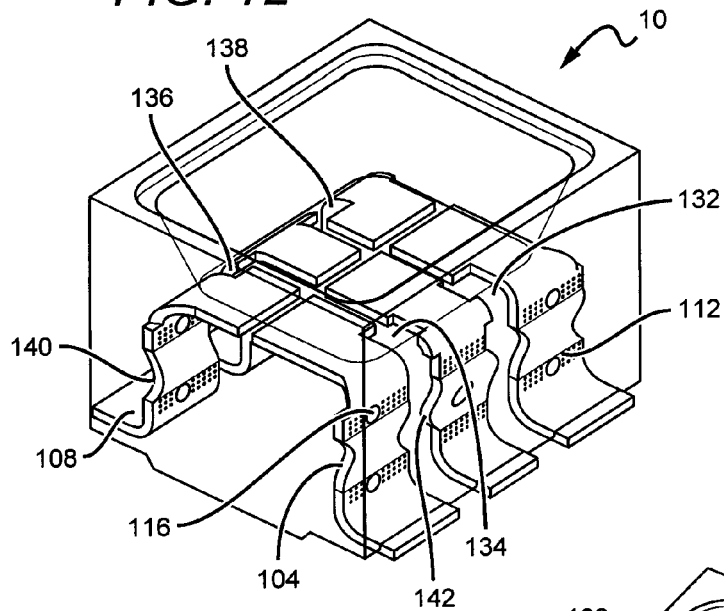
FIG. 12 is a perspective view of another possible embodiment for an emitter package according to the present invention.

FIGS. 12 and 13 depict another L-leg 108 lead frame embodiment according to the present invention. The lead frame comprises a variety of features to enhance adhesion between it and the casing, including spot punches 112, U-bends 104, through-holes 116, metal gaps 132, 134, 136, 138, other bends, indentations 140, and tabs 142.

Figure 14:
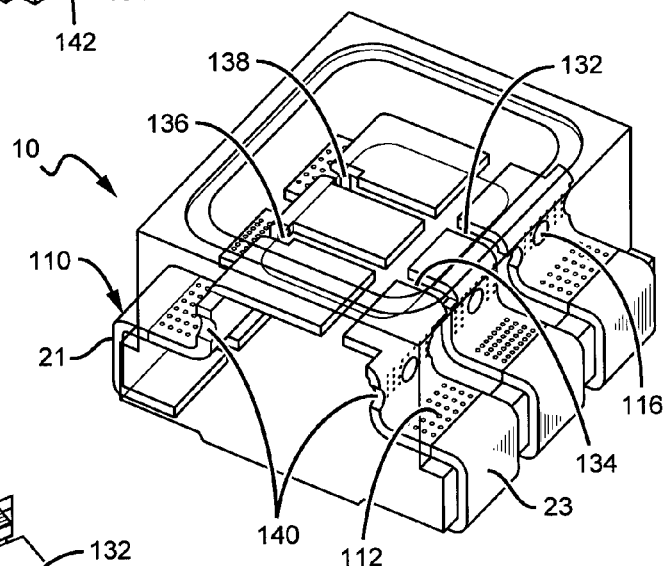
FIG. 14 is a perspective view of another possible embodiment for an emitter package according to the present invention.
Figure 15:
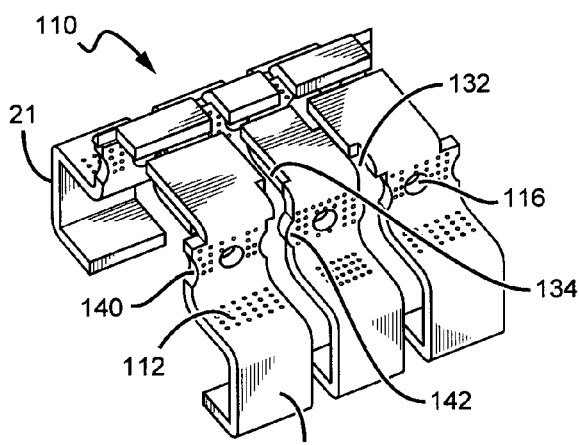
FIG. 15 is a perspective view of a possible lead frame that may be used in the emitter of claim 14.

FIGS. 14 and 15 depict another possible S-leg 110 lead frame embodiment. The lead frame 110 also comprises a variety of possible features to enhance casing/lead frame adhesion, such as stepped portions (inherent in the S-leg shape), spot punches 112, through-holes 116, metal gaps 132, 134, 136, 138, indentations 140, and tabs 142. FIG. 16 depicts still more possible embodiments for an S-leg 110 lead frame according to the present invention. S-legs (a), (b), and (c) are provided in packages all having substantially the same height, but the variations demonstrate different possible ways to achieve the S-leg 110 lead frame shape, utilizing various lead frame features to improve adhesion. For example, S-leg 110 version (a) comprises U-bends 104 along the length of its upper side portions. This can increase the overall height of the lead frame, which may result in a shallower cavity depth for the package if the overall height of the package does not increase. However, the additional U-bends 104 increases the available surface area for the casing to bond with. S-leg 110 version (b) comprises no U-bends along its length other than the inherent U-shape of its lower portion. This configuration does not necessitate a larger height for the lead frame, which may mean the depth of the cavity can be increased if desired without affecting the overall package height. S-leg 110 version (c) comprises one U-bend on each of its upper side portions.

FIGS. 17 and 18 depict two variations for through-holes according to the present invention. Regardless of the overall shape of the through-hole, through-holes according to the present invention may comprise features along their side surface to further enhance the adhesion between the casing and the lead frame. Through-holes may comprise smooth side surfaces as shown in FIG. 17. Through-holes such as these will strengthen casing and lead frame inter adhesion only in the perpendicular direction. Alternatively, the side surfaces may slant in toward one another, either being closer together at the top, at the bottom, or at both the top and the bottom (if the side surfaces are indented). The side surfaces of the through-holes 116 may also be roughened, indented, or may comprise projections (not shown), which may also enhance adhesion.

Alternatively, a stepped through-hole 117 may be provided, which may comprise one step (as shown in FIG. 18), or multiple steps to enhance adhesion. Steps may be squared, curved, and/or may comprise any angle type between them. Stepped through-holes 117 can strengthen casing and lead frame inter adhesion both horizontally and in a perpendicular direction with respect to the lead frame.

Figure 19:
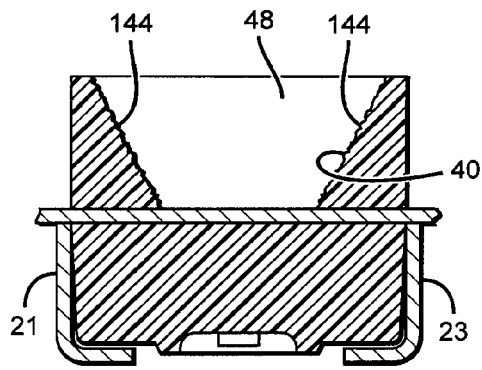
FIG. 19 is a cross-sectional side view showing cavity features for one possible embodiment of an emitter package according to the present invention.

FIGS. 19-22 show various cavity 40 features that may be included in embodiments of an emitter package according to the present invention. The cavity features may be provided to enhance the adhesion between an encapsulant 48 and cavity 40, and/or may be provided to increase adhesion between the cavity 40 and lead frame 14. In FIG. 19, roughened cavity surfaces 144 may be included. The roughened surfaces 144 provide additional surface area for the encapsulant to bond to, and can improve both the adhesion between the encapsulant and cavity 40 as well as the water resistance of the package. The roughened surfaces 144 may be formed by utilizing a casing mold (not shown) with complimentary roughened surfaces.

Figure 20:
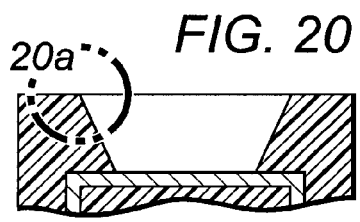
FIG. 20 is a cross-sectional side view of one possible embodiment for an emitter package according to the present invention.
Figure 20A:
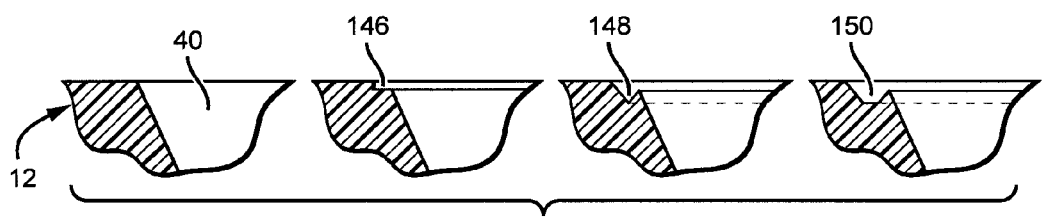

FIGS. 20 and 20*a* depict other possible cavity features for altering the topmost portion of the cavity. Flange 146 may be incorporated along the entire circumference or portions of the circumference of the top of the cavity 40. The flange 146 provides additional surface area at the top of the cavity 40 and casing 12, which can enhance the bonding between the encapsulant and the cavity and casing. Alternatively, a v-shaped trough 148 may be incorporated along the entire circumference or portions of the circumference at the top of cavity 40, which will likewise provide additional surface area to improve adhesion of the encapsulant. Flat-bottom trough 150 may also be incorporated along the entire circumference or portions of the circumference to improve adhesion. It is understood that variations of these cavity features are contemplated by the present invention, and each feature may be used alone or in any combination with other features.

Figure 21:
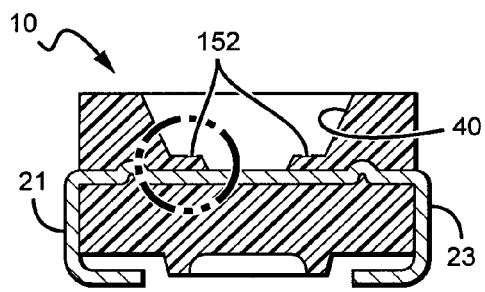
FIG. 21 is a cross-sectional side view of one possible embodiment for an emitter package according to the present invention.
Figure 22:
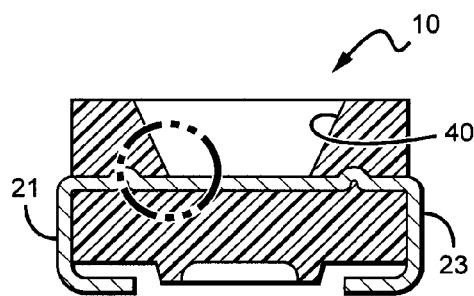
FIG. 22 is a cross-sectional side view of another possible embodiment for an emitter package according to the present invention.

FIG. 21 depicts another possible cavity feature for altering the bottom of the cavity, and FIG. 22 depicts a cavity with an unaltered bottom portion. FIG. 21 depicts a stepped bottom portion 152 around the entire circumference or portions of the circumference of the cavity 40 bottom. The stepped portion 152 can increase the casing material coverage at the bottom of the cavity, which can improve adhesion between both the lead frame and casing, and between the cavity and encapsulant. Such a stepped portion 152 can also improve the overall water resistance of the emitter package 10, by creating more surface area for water or other contaminants to have to cover before they can infiltrate the light emitting devices in the package and adversely affect the device's functionality. It is understood that variations of the stepped bottom portion 152 may be provided within the scope of the present invention.

FIGS. 23*a* and 23*b* depict a grouping of packages according to the present invention, showing that a taller overall package and/or minimal solder pin exposure out the end surfaces of the packages can be beneficial. When grouping two or more packages according to the present invention together (for a display for example), a material 154 may be incorporated between adjacent packages. The material 154 may be used to cover and protect the underlying support structure (such as a PCB), cover and protect exposed lead frame portions, improve the water resistivity of the resulting grouping, and provide additional benefits such as minimizing glare. The material 154 may be comprised of a black gel-like substance such as black silicone, but it is understood that other possible materials are contemplated by the present invention. However, the material 154 may become deposited irregularly as seen in FIG. 23*a*, and may not be deposited in sufficient quantities to cover and protect the solder pins exposed at the end surfaces of packages (as seen between the second and third packages of FIG. 23*a*).

Accordingly, it may be beneficial to provide a package having exposed solder pins shorter than the total height of the package, as seen in the S-leg lead frame packages of FIG. 23*b*. The solder pin length may be less than half the height of the package, or less than the height from the bottom of the package to the bottom of the cavity. Additionally or alternatively, the overall height of the package can be increased to improve the uniform deposition of material 154 between the packages, but this may not be a viable option in applications where a lower profile/thinner package is desired. When the material 154 is more uniformly deposited to cover solder pins and any other exposed components, the water resistivity of the resulting display is improved.

In an LED display according to the present invention, a driver PCB may be provided, upon which a large number of SMDs according to the present invention may be mounted. The SMDs may be arranged in rows and columns, with each SMD defining a pixel. The SMDs may comprise emitter packages such as those embodied by package 10. The SMDs may be electrically connected to traces or pads on a PCB, with the PCB connected to respond to appropriate electrical signal processing and driver circuitry. Each of the SMDs may carry a vertically or horizontally oriented, linear array of blue, red and green LEDs. Such a linear orientation of the LEDs has been found to improve color fidelity over a wide range of viewing angles. However, it is understood that each SMD may alternatively carry other configurations and color combinations of LEDs. The LEDs may be arranged in any linear or non-linear order, and less than or more than three LEDs in any desired color combination may be provided in accordance with the present invention.

While several illustrative embodiments of the invention have been shown and described, numerous variations and alternate embodiments will occur to those skilled in the art, such as utilizing the present invention for LED decorative lighting or the like. Such variations and alternate embodiments are contemplated, and can be made without departing from the spirit and scope of the invention as defined in the appended claims.

We claim:

1. An emitter package, comprising:
a casing comprising a cavity extending into an interior of the casing from a top surface of the casing;
an electrically conductive lead frame coupled to the casing and comprising a plurality of leads, each lead of the plurality of leads comprising a package mounting portion in a first plane, a device mounting portion in a plane other than the first plane, and an intermediate portion between the first plane and the second plane, at least one lead in the plurality of leads having a first surface, and a second surface opposite the first surface, in which the plurality of leads comprises a plurality of electrically conductive cathode parts and a plurality of electrically conductive anode parts, in which the plurality of electrically conductive anode parts are separated by a gap from the plurality of electrically conductive cathode parts;
at least one lead of the plurality of leads comprising at least one feature in a first portion of the electrically conductive lead frame, wherein the at least one feature comprises at least one of a through-hole, a cut, a spot punch, a U-bend, a projection, and an indentation, in which a material of the casing contacts the at least one feature, wherein the at least one feature is distinct from the gap and in at least the first surface and the second surface, in which a portion of the first surface and a portion of the second surface comprising the at least one feature is entirely inside the casing; and
a plurality of light emitting devices coupled to the electrically conductive lead frame, in which the plurality of light emitting devices and at least a second portion of the electrically conductive lead frame distinct from the first portion of the electrically conductive lead frame are exposed through the cavity.

2. The emitter package of claim 1, wherein the at least one feature comprises at least one through-hole;
wherein a shape of the at least one through-hole is a circle, a star, a polygon, a cross, an oval, a triangle, a square, a hexagon, a polygon, a diamond, or a rectangle.

3. The emitter package of claim 2, wherein said at least one through-hole comprises one or more steps.

4. The emitter package of claim 1, wherein at least one part in of the plurality of electrically conductive cathode parts and the plurality of electrically conductive anode parts is coupled to at least one of the light emitting devices, and each part in the plurality of electrically conductive anode parts and the plurality of electrically conductive cathode parts is electrically connected to one of the light emitting devices.

5. The emitter package of claim 1, wherein said light emitting devices are adapted to be energized to produce, in combination, all colors of the visible spectrum.

6. The emitter package of claim 4, wherein each of said light emitting devices comprises at least a first contact and a second contact, the first contact being electrically coupled to at least one part in the plurality of electrically conductive cathode parts, and the second contact is electrically coupled to at least one part in the plurality of electrically conductive anode parts.

7. The emitter package of claim 4, wherein:
the light emitting devices are arranged in a linear array extending in a first direction;
the plurality of electrically conductive anode parts are in a parallel relationship with each other; and
the plurality of electrically conductive cathode parts in parallel relationship with each other;
wherein the plurality of electrically conductive anode parts and the plurality of electrically conductive cathode parts extend in a second direction orthogonal to said first direction.

8. The emitter package of claim 1, wherein the electrically conductive lead frame comprises an electrically conductive metal or metal alloy.

9. The emitter package of claim 1, wherein the plurality of light emitting devices emit a plurality of colors.

10. The emitter package of claim 4, wherein each of the light emitting devices is attached to one part in the pluralities of electrically conductive cathode parts and electrically conductive anode parts via a wire bond and a respective part in the pluralities of electrically conductive cathode parts and electrically conductive anode parts via solder.

11. The emitter package of claim 1, wherein said casing is comprised of a plastic or resin.

12. The emitter package of claim 1, wherein a shape of a bottom of the cavity is different than a shape of a top of the cavity.

13. The emitter package of claim 1, further comprising a reflector in said cavity.

14. The emitter package of claim 1, wherein a shape of the electrically conductive lead frame is an L-leg configuration, a U-leg configuration, or an S-leg configuration.

15. The emitter package of claim 14, wherein the U-leg configuration and the S-leg configuration comprise a plurality of solder pins exposed on an outside of an end surface of the emitter package.

16. The emitter package of claim 1, wherein said features increase a surface area of said lead frame such that adhesion reliability between said casing and said lead frame is enhanced.

17. The emitter package of claim 1, wherein a first feature is on a vertical plane of the lead frame and a second feature is on a horizontal plane of the electrically conductive lead frame.

18. The emitter package of claim 17, wherein the second feature on the horizontal plane comprises a stepped portion along the electrically conductive lead frame.

19. The emitter package of claim 17, wherein the second feature on the horizontal plane comprises an indentation along the electrically conductive lead frame.

20. An emitter package, comprising:
a casing comprising a cavity extending into the interior of the casing from a top surface of the casing;
an electrically conductive lead frame comprising a package mounting portion at a first level and a device mounting portion at a level other than the first level, and a first surface and a second surface opposite the first surface, the electrically conductive lead frame being coupled to said casing, wherein the electrically conductive lead frame comprises an S-leg configuration or comprises an L-leg configuration in which the electrically conductive lead frame extends outside of the casing only at a bottom surface of the casing, and wherein a portion of the electrically conductive lead frame inside the casing comprises one or more bends, wherein a portion of said lead frame inside said casing comprises one or more U-bends, at least one of said U-bends being entirely in said casing; and
a plurality of light emitting devices coupled to the electrically conductive lead frame, the plurality of light emitting devices and portions of the electrically conductive lead frame exposed through the cavity;
wherein the electrically conductive lead frame comprises a plurality of electrically conductive cathode parts and a plurality of electrically conductive anode parts, in which the plurality of electrically conductive anode parts are separated by a gap from the plurality of electrically conductive cathode parts;
the electrically conductive lead frame comprising at least one feature in at least the first surface and the second surface such that a portion of the first surface and a portion of the second surface comprising the at least one feature is entirely encased by the casing.

21. The emitter package of claim 20, wherein the electrically conductive lead frame further comprises a plurality of solder pins which are exposed outside of an end surface of the casing.

\* \* \* \* \*